US008751462B2

(12) United States Patent
Huang et al.

(10) Patent No.: US 8,751,462 B2
(45) Date of Patent: *Jun. 10, 2014

(54) DELTA COMPRESSION AFTER IDENTITY DEDUPLICATION

(75) Inventors: Mark Huang, Seattle, WA (US); Edward K. Lee, San Jose, CA (US); Kai Li, Seattle, WA (US); Philip Shilane, Morrisville, PA (US); Grant Wallace, Ewing, NJ (US); Ming Benjamin Zhu, Austin, TX (US)

(73) Assignee: EMC Corporation, Hopkinton, MA (US)

( * ) Notice: Subject to any disclaimer, the term of this patent is extended or adjusted under 35 U.S.C. 154(b) by 763 days.

This patent is subject to a terminal disclaimer.

(21) Appl. No.: 12/291,998

(22) Filed: Nov. 14, 2008

(65) Prior Publication Data

US 2010/0125553 A1 May 20, 2010

(51) Int. Cl.
*G06F 17/00* (2006.01)
*G06F 7/00* (2006.01)
*G06F 11/14* (2006.01)

(52) U.S. Cl.
CPC ................................. *G06F 11/1453* (2013.01)
USPC ........... 707/692; 707/640; 707/693; 707/694; 711/161; 711/216

(58) Field of Classification Search
CPC .......................... G06F 11/1453; G06F 11/1464
USPC ........... 707/640, 692, 693, 694; 711/161, 216
See application file for complete search history.

(56) References Cited

U.S. PATENT DOCUMENTS

| | | | |
|---|---|---|---|
| 5,574,906 A | 11/1996 | Morris | |
| 5,990,810 A * | 11/1999 | Williams | 341/51 |
| 6,349,296 B1 | 2/2002 | Broder et al. | |
| 6,374,250 B2 | 4/2002 | Ajtai et al. | |
| 6,658,423 B1 * | 12/2003 | Pugh et al. | 1/1 |
| 7,287,019 B2 | 10/2007 | Kapoor et al. | |
| 7,567,188 B1 | 7/2009 | Anglin et al. | |
| 7,669,023 B2 | 2/2010 | Murase | |
| 7,747,584 B1 | 6/2010 | Jernigan, IV | |
| 7,921,077 B2 * | 4/2011 | Ting et al. | 707/610 |
| 7,949,662 B2 | 5/2011 | Farber et al. | |
| 8,190,835 B1 | 5/2012 | Yueh | |
| 2003/0097359 A1 | 5/2003 | Ruediger | |
| 2004/0174276 A1 | 9/2004 | McCanne et al. | |

(Continued)

FOREIGN PATENT DOCUMENTS

| | | |
|---|---|---|
| EP | 1641219 | 9/2005 |
| WO | 2004012338 A2 | 2/2004 |

OTHER PUBLICATIONS

Mandagere et al., "Data De-duplication using Object Based Storage", University of Minnesota Digital Technology Center Intelligent Storage Consortium, May 18, 2007.

(Continued)

*Primary Examiner* — Shew-Fen Lin
(74) *Attorney, Agent, or Firm* — Van Pelt, Yi & James LLP (57) ABSTRACT

Delta compression after identity deduplication is disclosed. A first data segment is determined to be identical to a first previous data segment. A second data segment, not determined to be identical to a second previous data segment, is then determined to be similar to a third previous data segment.

43 Claims, 7 Drawing Sheets

(56) References Cited

U.S. PATENT DOCUMENTS

| | | | |
|---|---|---|---|
| 2005/0044294 | A1 | 2/2005 | Vo et al. |
| 2005/0086246 | A1 | 4/2005 | Wood et al. |
| 2005/0131939 | A1* | 6/2005 | Douglis et al. ............ 707/103 Y |
| 2005/0182780 | A1 | 8/2005 | Forman et al. |
| 2005/0219075 | A1* | 10/2005 | Storer et al. .................... 341/51 |
| 2006/0101060 | A1* | 5/2006 | Li et al. ......................... 707/102 |
| 2007/0239946 | A1 | 10/2007 | Zhu |
| 2008/0013830 | A1 | 1/2008 | Patterson et al. |
| 2008/0109428 | A1 | 5/2008 | Suciu et al. |
| 2008/0133561 | A1* | 6/2008 | Dubnicki et al. ............ 707/101 |
| 2008/0256143 | A1* | 10/2008 | Reddy et al. .................. 707/204 |
| 2009/0193223 | A1 | 7/2009 | Saliba et al. |
| 2009/0234892 | A1 | 9/2009 | Anglin et al. |

OTHER PUBLICATIONS

Douglis et al., "Application-specific Delta-encoding via Resemblance Detection", IBM T. J. Watson Research Center, 2002.

Nevin Heintze, "Scalable Document Fingerprinting" (Extended Abstract), Bell Laboratories, 1996.

Spring et al. "A Protocol-Independent Technique for Eliminating Redundant Network Traffic", In Proc. of ACM SIGCOMM, pp. 87-95, Aug. 2000.

Muthitacharoen et al. "A Low-bandwidth Network File System", In *Proceedings of the ACM 18th Symposium on Operating Systems Principles*. Banff, Canada. Oct. 2001.

Jain et al. "TAPER: Tiered Approach for Eliminating Redundancy in Replica Synchronization", 4th USENIX Conference on File and Storage Technologies (FAST '05), Dec. 14-16, 2005, San Francisco, CA.

Andrew Tridgell "Efficient Algorithms for Sorting and Synchronization". Doctor of Philosophy Thesis, The Australian National University, Feb. 1999.

Chan et al. "Cache-Based Compaction: A New Technique for Optimizing Web Transfer", *Mobile and Wireless Internet: Protocols, Algorithms and Systems*, edited by Kia Makki et. al. Kluwer Academic Publishers, Jul. 2003.

Karp et al. "Efficient randomized pattern-matching algorithms", *IBM Journal of Research and Development* 31 (2), 249-260. Mar. 1987.

Randal C. Burns, "Differential Compression: A Generalized Solution for Binary Files" MS Thesis, University of California at Santa Cruz, 1997.

Joshua P. MacDonald, "File System Support for Delta Compression", Masters thesis. Department of Electrical Engineering and Computer Science, University of California at Berkeley, 2000.

Ajtai et al. "Compactly Encoding Unstructured Inputs with Differential Compression" *J. ACM* 49, 3. pp. 318-367. May 2002.

Douglis et al. "Application-Specific Delta-Encoding via Resemblance Detection", In Proc. of the USENIX Annual Technical Conference, Jun. 2003.

Suel et al. "Algorithms for Delta Compression and Remote File Synchronization", In Khalid Sayood, editor, Lossless Compression Handbook. Academic Press, 2002.

Trendafilov et al. "Zdelta: An Efficient Delta Compression Tool", Technical Report TR-CIS—Feb. 2002, Polytechnic University, Jun. 26, 2002.

Andrei Z. Broder, "Algorithms for Duplicate Documents", Lecture Notes, Feb. 18, 2005.

Andrei Z. Broder "Identifying and Filtering Near-Duplicate Documents", COM '00: Proceedings of the 11th Annual Symposium on Combinatorial Pattern Matching. pp. 1-10, Springer-Verlag, 2000.

Andrei Z. Broder, "On the Resemblance and Containment of Documents", In Proceedings of Compression and Complexity of Sequences 1997.

Broder et al. "Syntactic Clustering of the Web", Computer Networks. 29(8-13): 1157-1166. 1997. http://www.std.org/~msm/common/clustering.html.

Broder et al. "Min-Wise Independent Permutations", Journal of Computer Systems and Sciences, vol. 60(3), pp. 630-659 (2000) (special issue for STOC '98), preliminary version in Proceedings of the 30th Annual ACM Symposium on Theory of Computing (1998).

Moses S. Charikar, "Similarity Estimation Techniques from Rounding Algorithms", *Proceedings of the 34th Annual ACM Symposium on Theory of Computing*, pp. 380-388. 2002.

Monika Henzinger, "Finding Near-Duplicate Web Pages: A Large-Scale Evaluation of Algorithms", In *29th Annual International ACM SIGIR Conference on Research and Development in Information Retrieval*, vol. 2006, pp. 284-291, 2006.

Broder et al. "On the Computation of the Minima of Random Functions", paper submitted for the conference: Algorithm Engineering, 3rd International Workshop, WAE '99, London, UK, Jul. 19-21, 1999.

Udi Manber, "Finding Similar Files in a Large File System", In *Proceedings of the USENIX Winter 1994 Technical Conference*, San Francisco, CA, USA, 1994.

Bobbarjung et al. "Improving Duplicate Elimination in Storage Systems", ACM Transactions on Storage, vol. 2, No. 4, Nov. 2006, pp. 424-448.

Kulkarni et al. "Redundancy Elimination Within Large Collections of Files" https://iweb.datadomain.com/princeton/files/bib/douglis04.pdf, USENIX Annual Technical Conference, Boston, MA, Jun. 2004.

\* cited by examiner

DELTA COMPRESSION AFTER IDENTITY DEDUPLICATION

BACKGROUND OF THE INVENTION

Enterprises as well as individuals are becoming increasingly dependent on computers. As more and more data are generated, the need for efficient and reliable data backup storage systems is increasing. There are a variety of systems in existence today, utilizing both local and network storage for backup. Some of these storage systems use data segmentation and deduplication to more efficiently store the data. Deduplicating backup systems break an incoming data stream into a series of data segments and test the system for the presence of each data segment before storing it, in order to avoid storing it multiple times. Some deduplicating backup systems can achieve high data compression factors of 10 to 50 or more. However, for a large enterprise system, a backup system compressed by deduplication can still be so large as to be cumbersome.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Delta compression after identity deduplication is disclosed. Deduplicating systems break an incoming data stream into a series of data segments and test the system for the presence of each data segment before storing it, in order to avoid storing it multiple times. When used on enterprise systems where there is a high degree of data redundancy, deduplication can reduce the total amount of data stored by a large amount. After redundant segment data has been removed from the storage system by deduplication, there is still redundancy that can be removed in the form of similar data segments with small differences. Delta compression identifies a previously stored data segment that is similar to a segment that is desired to be stored and compresses it for storage by storing the segment that is desired to be stored as a reference to the previously stored segment and storing a delta (or difference) from the previously stored segment. In some embodiments, a segment that is desired to be stored can also be stored as a delta from a segment that has been previously stored as a reference and a delta. For segments that are very similar but not identical, no data reduction would be achieved by deduplication alone, but a large amount of data reduction is possible with delta compression. Reducing the data set by deduplication increases the feasibility of delta compression, as delta compression requires considerably more processing power than deduplication and would be slow to perform on the entire data set.

In some embodiments, a segment is similar to more than one previously stored segment or portions thereof and the more than one previously stored segments are used for the encoding of the segment. For example, a segment's first half is similar to a first previously stored segment and a segment's second half is similar to a second previously stored segment; the segment is stored by using a reference to the first and second previously stored segments and indicators for which portion(s) of the segments are used and in what manner they are used to be able to reconstruct the segment.

In some embodiments, a sketch system uses or does not use a cache to find similar segments. In some embodiments, a sketch system uses one or more functions to characterize a segment and can use the characteristics generated by those functions to determine similarity and in some cases degree or amount of similarity.

Figure 1:
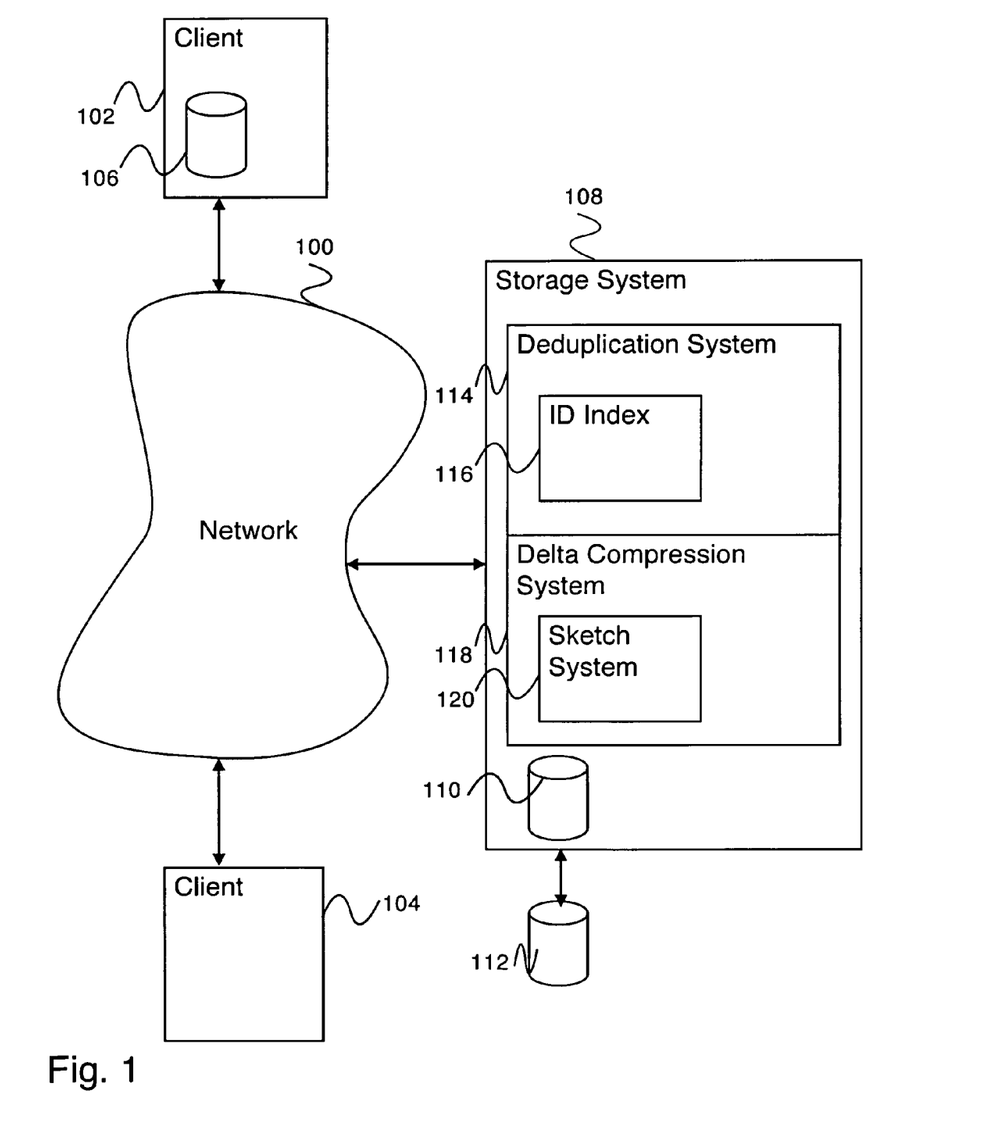
FIG. 1 is a block diagram illustrating a system for delta compression after identity deduplication.

FIG. 1 is a block diagram illustrating a system for delta compression after identity deduplication. In the example shown, network 100 connects to one or more clients, represented in FIG. 1 by clients 102 and 104. A client may have a local storage device in addition to local memory. For example, client 102 has storage device 106, whereas client 104 does not have a local storage device. Network 100 also connects to storage system 108. Storage system 108 stores data either using internal storage device 110 or attached external storage device 112.

Storage system 108 comprises deduplication system 114, which performs segment deduplication on an incoming data stream. Segment deduplication is assisted by identifier (ID) index 116, which comprises identifier (ID) data associated with a segment used to store data and/or files by storage system 108, along with a corresponding location in memory of the segment. Storage system 108 comprises delta compression system 118, which performs delta compression on an incoming data stream. Delta compression is assisted by sketch system 120, which comprises sketch data associated with a segment, along with the corresponding location in a data storage unit of the segment (e.g., internal storage device 110, external storage device 112, a storage system cache, a local memory, or any other appropriate storage unit). In some embodiments, sketch data comprises one or more data characterizing a segment. In some embodiments, one or more functions (e.g., hash functions) act on a segment and a subset of the results of the functions acting on the segment (e.g., a number of results, for example the ten lowest results or the ten highest results) are selected as a sketch.

Network 100 comprises one or more of the following: a local area network, a wide area network, a wired network, a wireless network, the Internet, a fiber network, a storage area network, or any other appropriate network enabling communication. Clients 102 and 104 may be in physical proximity or may be physically remote from one another. Storage system 108 may be located in proximity to one, both, or neither of clients 102 and 104.

In various embodiments, storage devices 106, 110 and 112 comprise a single storage device such as a hard disk, a tape drive, a semiconductor memory, a plurality of storage devices such as a redundant array system (e.g., a redundant array of independent disks (RAID)), a system for storage such as a library system or network attached storage system, or any other appropriate storage device or system.

In various embodiments, storage system 108 comprises one or more processors as part of one or more physical units (e.g., computers or other hardware units).

In some embodiments, files or data stored on a client are backed up on storage system 108. The files or data are broken into segments by storage system 108. A mapping is stored between the files or data and the segments. If an identical segment is already stored by storage system 108, a pointer to the segment is stored. If a similar segment is already stored by storage system 108, a pointer to the similar previously stored segment is stored as well as the difference between the similar previously stored segment and the new segment to be stored. The mapping along with the pointers, stored segments and stored similar segments and differences from the similar segments can be used to reconstruct the original files or data.

Figure 2:
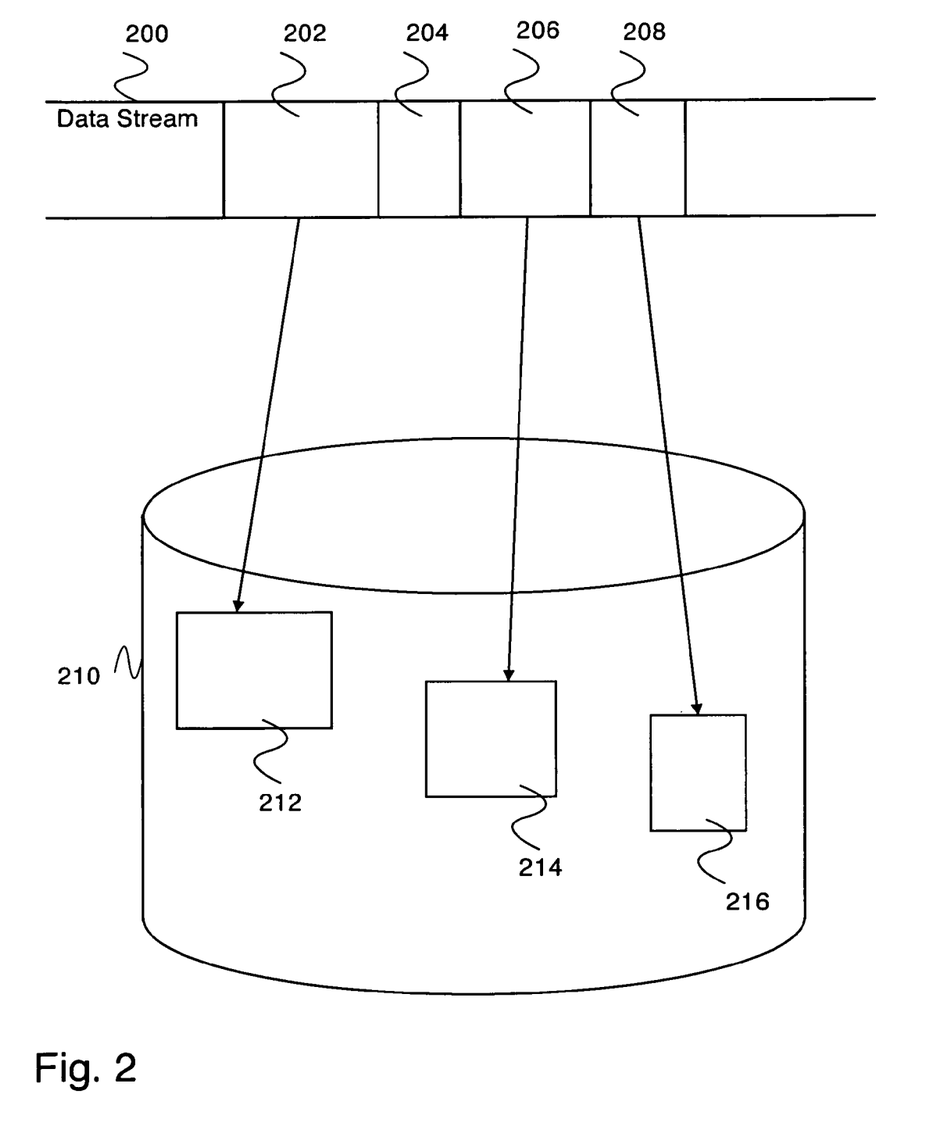
FIG. 2 is a block diagram illustrating an embodiment of a segment deduplication data storage system.

FIG. 2 is a block diagram illustrating an embodiment of a segment deduplication data storage system. In the example shown, data stream or data block 200 is received by a data storage system (e.g., storage system 108 of FIG. 1). Data stream or data block 200 is sent from one or more clients (e.g., client 102 or client 104 of FIG. 1). Data stream or data block 200 is to be stored in storage device 210, representing a storage device of a storage system (e.g., storage device 110 or storage device 112 of storage system 108 of FIG. 1).

Data stream or data block 200 is segmented into segments 202, 204, 206 and 208. Data stream or data block 200 is segmented by creating a plurality of segments from data stream or data block 200 that can be used to reconstruct data stream or data block 200. Segments, when used to reconstruct data stream or data block 200, can be overlapping, non-overlapping, or a combination of overlapping and non-overlapping. Segment boundaries are determined using file boundaries, directory boundaries, byte counts, content-based boundaries (e.g., when a hash of data in a window is equal to a value), or any other appropriate method of determining a boundary. Reconstruction of a data block, data stream, file, or directory includes using one or more references to the one or more segments that originally made up a data block, data stream, file, or directory that was/were previously stored.

Storage device 210 is checked for existence of data segments to be stored (e.g., to see if a data segment is currently already stored), such as data segments 202, 204, 206, and 208. Data segments are stored if found to not exist within the storage device. Existence checking is performed by generating a smaller ID data and searching a table of IDs (e.g., an ID index such as ID index 116 of FIG. 1) corresponding to segments currently stored for the ID of the data segment to be stored. In some embodiments, existence checking is performed by searching storage device 210 for the entire data segment to be stored. ID data for a given data segment is derived from the content of the data of the segment and is generated deterministically (e.g., a digital fingerprint, digital signature, using a hash function, a checksum, a cryptographic hash function, etc.). In various embodiments, ID data is not derived from the content of the data, is generated randomly, or any other appropriate manner for the storage system.

In the example shown, data segments such as segments 202, 206, and 208 are found not to exist in storage device 210 and are designated to be stored in storage device 210—for example, segments 202, 204, and 206 are to be stored as data segments 212, 214, and 216, respectively. Segment 204 is found to exist within storage device 210, so a reference to 204 (not shown in FIG. 2) is stored in order to be able to reconstruct data stream or data block 200.

Figure 3:
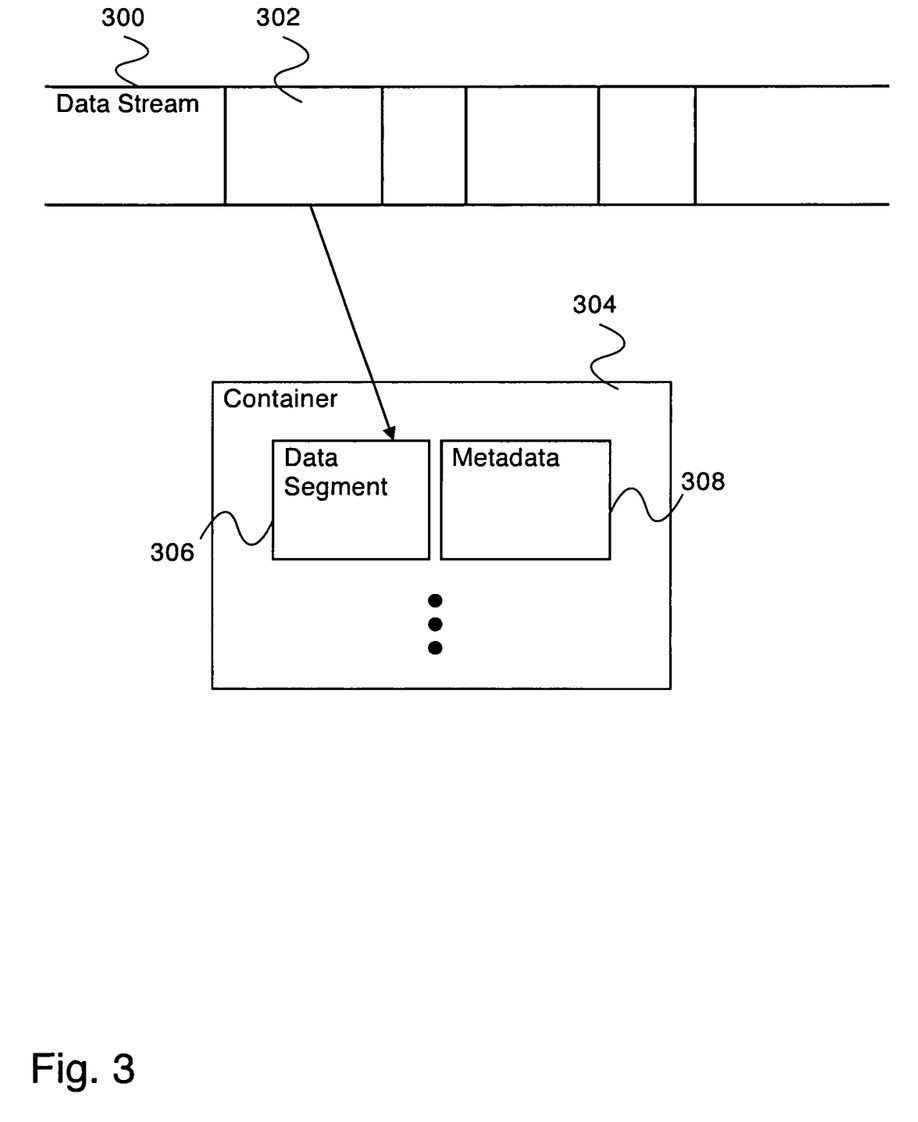
FIG. 3 is a block diagram illustrating an embodiment of data segmentation and storage.

FIG. 3 is a block diagram illustrating an embodiment of data segmentation and storage. In the example shown, data stream 300 is received by a data storage system (e.g., storage system 108 of FIG. 1). Data stream 300 is sent from one or more clients (e.g., client 102 or client 104 of FIG. 1). Data stream 300 is to be stored in a storage device of a storage system (e.g., storage device 110 or storage device 112 of FIG. 1). Data stream 300 is segmented into a plurality of data segments, including data segment 302. In some embodiments, segments are segmented by identifying segment boundaries that are content-based—for example, a hash function is applied to values of data within a sliding window through the data stream or block and when the hash function is equal to a value (or equal to one of several values) then a segment boundary is identified. In various embodiments, segment boundaries are identified using content based functions operating on windows within a data stream or block that have a minimum or maximum or other value or any other appropriate content based segmenting algorithm. In various embodiments, segments comprise fixed-length segments, variable length segments, overlapping segments, non-overlapping segments, segments with a minimum size, segments with a maximum size, or any other appropriate segments. In various embodiments, segments comprise files, groups of files, directories, a portion of a file, a portion of a data stream with one or more boundaries unrelated to file and/or directory boundaries, or any other appropriate segment.

Data segment 302 is stored in the storage system as stored data segment 306. Stored data segment 306 is stored as part of data storage container 304. Data storage container 304 stores one or more data segments along with metadata associated with the data segments. For example, metadata associated with data segment 306 is stored as metadata 308. Metadata 308 comprises a data segment ID and a data segment sketch. In various embodiments, a data segment ID comprises a deterministic function of a data segment, a plurality of deterministic functions of a data segment, a hash function of a data segment, a plurality of hash functions of a data segment, random data, or any other appropriate data segment ID. In various embodiments, a data segment sketch comprises one or more deterministic functions of a data segment, one or more hash functions of a data segment, one or more functions that return the same value for similar data segments, one or more functions that return similar values for similar data segments, one or more functions that may return the same value for similar data segments (e.g., a function that probably or likely returns a same value for a similar data segment), one or more functions that may return similar values for similar data segments (e.g., a function that probably or likely returns a similar value for a similar data segment), random data, or any other appropriate data segment sketch. In various embodiments, sketch function values are determined to be similar using one or more of the following methods: numeric difference, hamming difference, locality-sensitive hashing, nearest-neighbor-search, other statistical methods, or any other appropriate methods of determining similarity.

In various embodiments, metadata (e.g., metadata 308) comprises a data segment ID, a data segment sketch, a hash of a data segment, an encrypted hash of a data segment, random data, or any other appropriate metadata.

In some embodiments, metadata associated with a segment is used to identify identical and/or similar data segments. In some embodiments, stored metadata enables a faster identification of identical and/or similar data segments as an identifier (e.g., an ID) and/or sketch (e.g., a set of values characterizing the data segment) do not need to be recomputed for the evaluation of a given incoming data segment.

Figure 4:
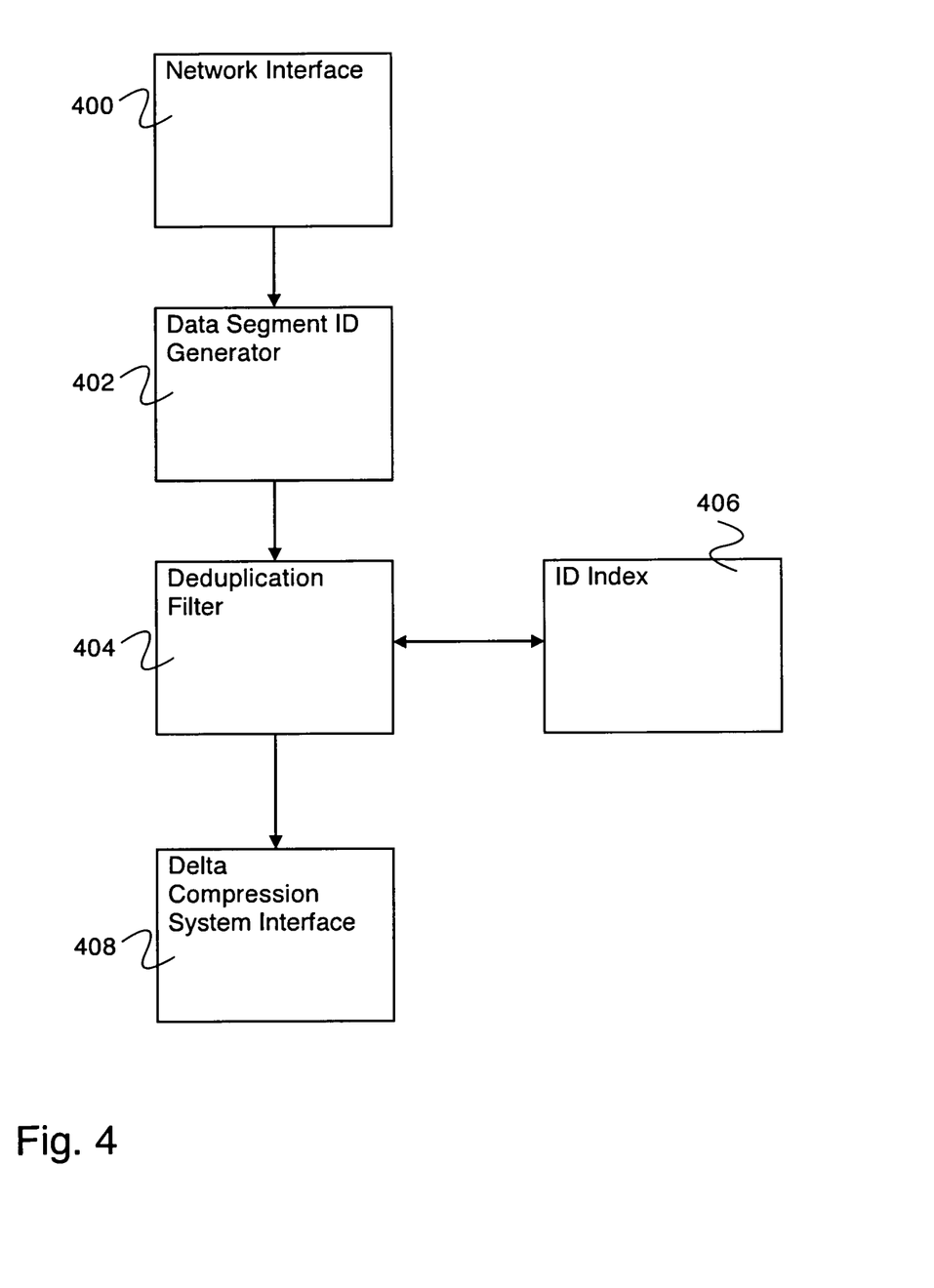
FIG. 4 is a block diagram illustrating an embodiment of a deduplication system.

FIG. 4 is a block diagram illustrating an embodiment of a deduplication system. In some embodiments, the deduplication system of FIG. 4 implements deduplication system 114 of FIG. 1. In the example shown, a data segment to be stored is received by network interface 400 and is passed to data segment ID generator 402. Data segment ID generator 402 generates a data segment ID from the data segment and passes the ID to deduplication filter 404. Deduplication filter 404 then queries ID index 406 for the data segment ID. If the data segment ID is found in ID index 406, deduplication filter 404 does not allow the data segment to be stored. If the ID is not found in ID index 406, deduplication filter 404 passes the received data segment to a delta compression system via delta compression system interface 408.

In some embodiments, in the event that a data segment is not new, a reference is stored as well as other information such that an incoming data stream or data block or file thereof is able to be reconstructed using the previously stored data segment.

In some embodiments, in the event that the data segment is new, the data segment is stored as well as other information such that an incoming data stream or data block or file thereof is able to be reconstructed using the newly stored data segment.

Figure 5:
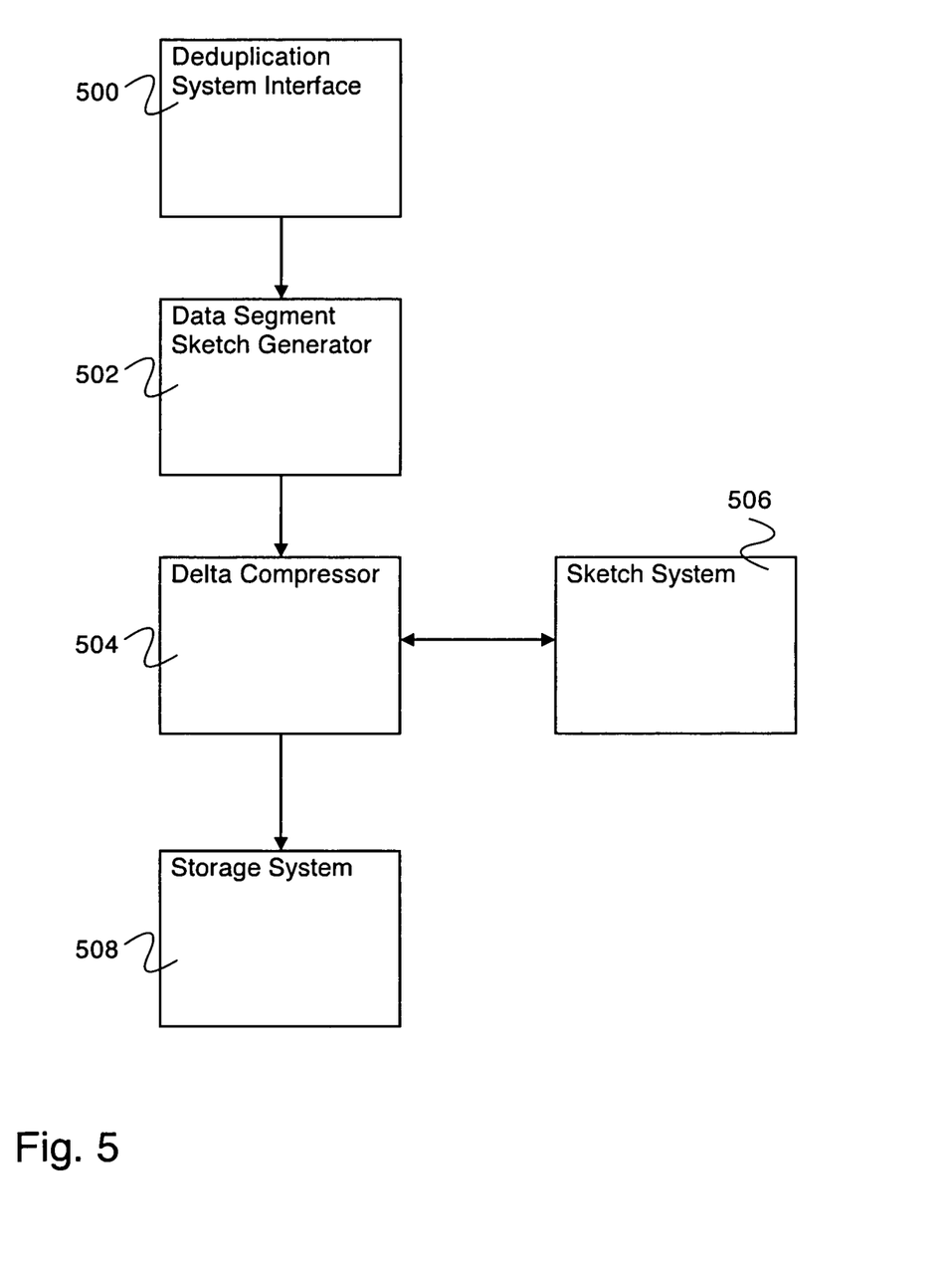
FIG. 5 is a block diagram illustrating an embodiment of a delta compression system.

FIG. 5 is a block diagram illustrating an embodiment of a delta compression system. In some embodiments, the delta compression system of FIG. 5 implements delta compression system 118 of FIG. 1. In the example shown, a data segment to be stored is received by deduplication system interface 500 and is passed to data segment sketch generator 502. Data segment sketch generator 502 generates a data segment sketch from the data segment and passes the sketch to delta compressor 504. Delta compressor 504 then queries sketch system 506 for the data segment sketch. If the data segment sketch is found to be similar or identical to one or more previously stored segment sketches by sketch system 506, delta compressor 504 performs delta compression on the received data segment using the one or more data segments associated with the one or more sketches found to be similar or identical by sketch system 506 as a base segment. The delta compressed data segment is then passed to storage system 508 and stored. If the sketch is not found to be similar or identical by sketch system 506, delta compressor 504 passes the received data segment to storage system 508 to be stored as a new data segment in the storage system.

Figure 6:
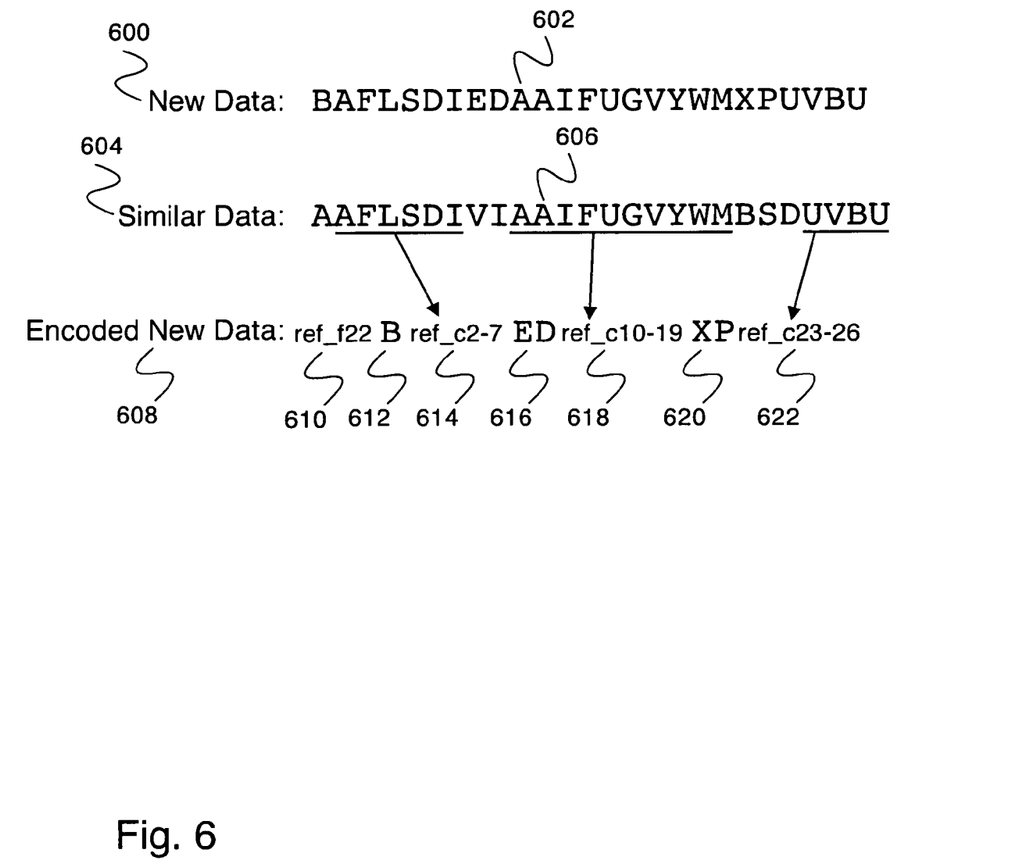
FIG. 6 is a diagram illustrating an embodiment of delta compression.

FIG. 6 is a diagram illustrating an embodiment of delta compression. In some embodiments, delta compression is performed by delta compressor 504 of FIG. 5. In the example shown, new data 600 is to be delta compressed. New data 600 comprises character sequence 602. Similar data 604 has been identified previously to be similar to new data 600. Similar data 604 comprises character sequence 606. In various embodiments, similar data 604 is identified to be similar to new data 600 using a sketch index, a sketch cache, database searching, or by any other appropriate method. Encoded new data 608 comprises reference 610 (e.g., a reference to a previously stored segment), character sequence references 614, 618, and 622 (e.g., a reference to a sequence of data from within the previously stored segment identifying the subset of the segment for example using offsets, lengths or any other appropriate manner of identifying the subset), and character sequences 612, 616, and 620 (e.g., a sequence of data—for example, a string of characters, bytes, integers, whole numbers or other—that is to be inserted in between the reference sequences). Reference 610 refers to similar data 604 and indicates that the character sequence references refer to character sequences found in similar data 604. Character sequence reference 614 indicates that characters 2-7 of similar data 604 are to be inserted in its position when reconstructing new data 600 from encoded new data 608; character sequence reference 618 indicates that characters 10-19 of similar data 604 are to be inserted in its position when reconstructing new data 600 from encoded new data 608; and character sequence reference 622 indicates that characters 23-26 of similar data 604 are to be inserted in its position when reconstructing new data 600 from encoded new data 608. Character sequences 612, 616, and 620 are not found in similar data 604, so they appear unchanged in encoded new data 608 and remain when new data 600 is reconstructed from encoded new data 608.

In some embodiments, the encoding comprises an indication of a set of data blocks in the second data segment not present in the third previous data segment and an indication of a set of data blocks in the third previous data segment. In some embodiments, encoded new data sequences use other encoding schemes that enable the indication of using portion(s) of a previously stored segment and differences (e.g., similar to the character sequences above) to store a new data segment. In various embodiments, the similar data and the new data comprise sets of characters, bytes, integers, whole numbers, dates, and/or any other appropriate data or combination thereof.

In some embodiments, the delta encoding comprises an ordered set of copy and insert instructions. New data 600 and similar data 604 are first broken into regions. Region boundaries are determined using file boundaries, directory boundaries, byte counts, content-based boundaries (e.g., when a hash of data in a window is equal to a value), or any other appropriate method of determining a boundary. ID data is computed for each region of new data 600 and similar data 604. ID data for a given data region is derived from the content of the data of the region and is generated deterministically (e.g., a digital fingerprint, digital signature, using a hash function, a checksum, a cryptographic hash function, etc.). The IDs of regions of similar data 604 are kept in a searchable list. The list of region IDs from similar data 604 is checked for each region ID from new data 600. If a region ID from new data 600 is not found in the list of region IDs from new data

600, an insert instruction is added to encoded new data 608, followed by the corresponding data region from new data 600.

If a region ID from new data 600 is found in the list of region IDs from new data 600, the corresponding data regions are identical. The regions are then extended from the front and back while checking to make sure that the regions still match. When the largest possible matching region has been found, a copy instruction is added to encoded new data 608 indicating to copy the matching region from similar data 604 when decoding encoded new data 608. If extending the ends of the data region causes the region to overlap data that has been included in encoded new data 608 as part of a previous copy or insert instruction, the previous instruction is modified to remove the overlap. The copy and insert instructions are stored or transmitted when the entire new data 600 can be reconstructed from the copies of similar data 604 and the insertions.

In some embodiments, data from two or more similar segments is used to encode a new data segment. Reconstruction of data from the two or more similar segment encoding is achieved using copy references to region(s) of the two or more similar segments and insertions.

Figure 7:
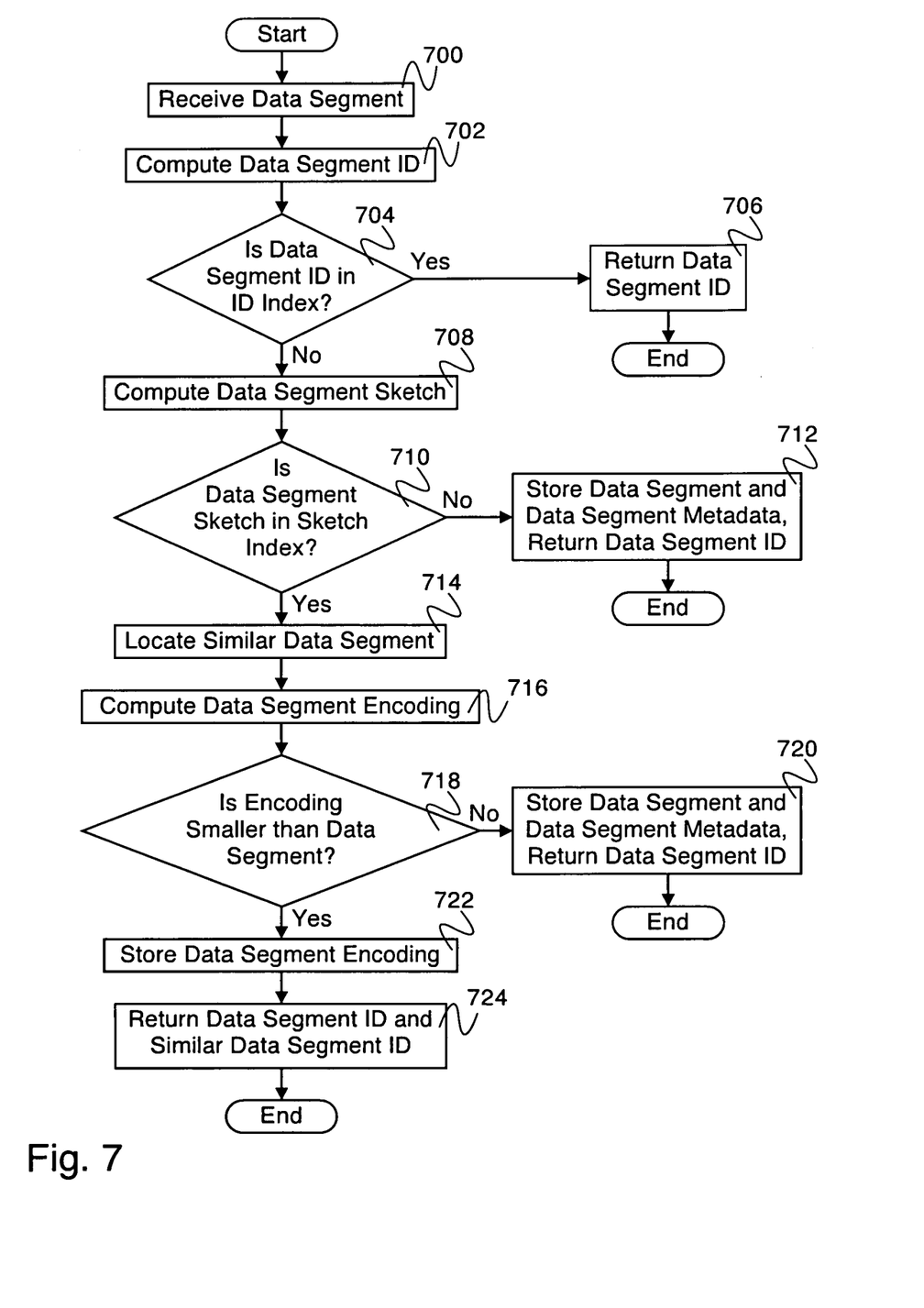
FIG. 7 is a flow diagram illustrating an embodiment of a process for delta compression after identity deduplication.

FIG. 7 is a flow diagram illustrating an embodiment of a process for delta compression after identity deduplication. In some embodiments, the process of FIG. 7 is used by storage system 108 of FIG. 1 to perform delta compression after identity deduplication. In the example shown, in 700, a data segment is received by the data storage system. The data segment received in 700 is part of a received data stream or data block comprising a plurality of data segments. In 702, the data segment ID is computed by the data storage system. The data segment ID is used to determine whether the data segment is identical to a previous data segment. In various embodiments, determining the data segment ID uses one or more of the following: a fingerprint function, a hash function, a cryptographic hash function, a digital signature, or any other appropriate method for determining a data segment ID. In 704 the ID index (e.g., ID index 116 of FIG. 1) is checked for the ID computed in 702. In the event that the ID computed in 702 is located in the ID index, then the data segment is determined to be identical to a previous data segment, and control passes to 706. In 706, the data segment ID is returned, and the process ends. In some embodiments, a reference to the received data segment is stored, enabling reconstruction of a data stream or data block associated with the received data segment. In various embodiments, a data stream or data block can include a plurality of files, data structures, file structures, metadata information, or any other appropriate data. In some embodiments, the received data segment is not stored after it is determined to be identical to a previous data segment.

In some embodiments, in the event that the ID computed is identical to an ID in an ID index, a check is performed to determine if the received segment is identical to the previously stored segment (e.g., a byte by byte comparison of the received segment and the previously stored segment).

In the event that the data segment ID is not found in the ID index in 704, then the data segment is not determined to be identical to a previous data segment, and control passes to 708. In 708, the data segment sketch is computed by the data storage system. The data segment sketch is used to determine whether the data segment is similar to a previous data segment. In 710, the sketch system (e.g., sketch system 120 of FIG. 1) is checked for the computed data segment sketch. In the event that a sketch of a previously stored segment (e.g., stored in the sketch system) is similar to or identical to the sketch of the received segment, the previously stored segment is determined to be similar to the received segment. In various embodiments, a sketch system comprises a sketch index which associates data segment sketches with data segment IDs, a sketch cache which associates a subset of data segment sketches with data segment IDs, or any other appropriate system for identifying similar sketches (e.g., those using metadata 308 and associated segment data 306). In various embodiments, a sketch cache is comprised of data-stream locality information, identity matching information, storage sub-system information, temporal locality, spatial locality, access patterns, historical patterns, or any other appropriate information. In the event that the computed data segment sketch is not found to be similar to one or more sketches in the sketch system, then the data segment is not determined to be similar to a previous data segment, and control passes to 712. In 712, the data segment is stored along with data segment metadata, the ID associated with the data segment is returned, and the process ends. In some embodiments, data segment metadata includes the data segment sketch. In various embodiments, the data segment is compressed, transmitted, replicated, or processed in any appropriate way. In the event that the computed data segment sketch is found in the sketch system in 710, then the data segment is similar to a previous data segment, and control passes to 714.

In 714, a data segment identified from the sketch system to be similar to the received data segment is located in the data storage system. In 716, an encoding of the received data segment is computed. In various embodiments, the delta compression encoding (e.g., delta compression of FIG. 6) is based at least in part on the similar data segment and comprises a set of data blocks in the data segment not present in the previously stored similar data segment and a set of references to subsets of data in the previously stored data segment (e.g., data offsets into the similar data segment, a data offset and length of sequence, or any other appropriate encoding). In some embodiments, one or more data segments are identified to be similar to the received data segment in addition to the similar data segment identified in 714. In some embodiments, the delta compression encoding is based at least in part on the similar data segment identified in 714 and the one or more additional similar data segments. In various embodiments, the one or more data segments identified or selected to be similar to the received data segment are identified or selected based at least in part on one or more of the following: temporal locality (e.g., a segment received at a time similar to the time another segment is received), spatial locality (e.g., a segment stored in a location similar or close to another segment), ease of access (e.g., a segment is readily accessed as compared to another segment, located at an access point, located at a memory boundary, etc.), expected compression (e.g., the segment is expected to compress to a desirable size, below a threshold size, etc.), frequency of selection for other compressed segments (e.g., the segment is used as a reference to store a plurality of other segments, where the plurality is above a threshold size or is a maximum or in a "top ten" or other list, etc.), or based on any other appropriate criteria.

In 718, the encoding is checked to see if it is smaller than the received data segment. If it is determined that the encoding is not smaller than the received data segment, control passes to 720. In 720, the data segment is stored in the database along with data segment metadata, the ID associated with the data segment is returned, and the process ends. In some embodiments, if the encoding is not smaller than the received data segment, the encoding is not stored. In some embodiments, if the encoding is not smaller than the received data segment, the encoding is stored in place of or in addition to the received data segment.

If it is determined in 718 that the encoding is smaller than the received data segment, control passes to 722. In 722, the encoding is stored. In various embodiments, the encoding is compressed (e.g., using Huffman coding, Lempel-Ziv coding, Lempel-Ziv-Welch coding, etc.), transmitted (e.g., transmitted between two systems where a reduction in transmitted data is desired and the deduplicated and delta compressed segments enable a reduced amount of data transmitted between two systems), replicated (e.g., stored on a replica system that replicates data stored on the storage system), or processed in any other appropriate way. In 724, the received data segment ID and similar data segment ID are returned, and the process ends. In some embodiments, the data segment ID is returned and the similar data segment ID is stored with the encoding.

In some embodiments, the decision for 718 is based on a percentage reduction of the storage required for the segment. For example, if the encoded data segment is bigger than the 80% of the size of the data segment, then the data segment is stored as itself and not as a reference to a previously stored segment and a difference (e.g., an encoded data segment). In some embodiments, the decision for 718 is based at least in part on the balance between the computation required for reconstruction of the encoded segment versus the space utilized for storing a segment and/or the encoded segment.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for processing data, comprising:
   a deduplicating system, wherein the deduplicating system comprises a processor and a storage unit, wherein the deduplicating system is configured for determining, using the processor, whether a first data segment is identical to a first previously stored data segment in the storage unit, wherein in the event that the first data segment is determined to be identical to the first previously stored data segment, a reference to the first data segment is stored in the storage unit; and
   a delta compression system is configured for determining, only in the event that the first data segment is determined not to be identical to the first previously stored data segment, whether the first data segment is similar to a second previously stored data segment, wherein the first data segment is determined to be similar to the second previously stored data segment using a sketch function and the sketch function comprises one or more functions that returns a same value for similar data segments;
   wherein in the event that the first data segment is determined to be similar to the second previously stored data segment, the delta compression system is further configured for computing an encoding of the first data segment, wherein the encoding comprises determining one or more differences between the first data segment and the second previously stored data segment, and storing, in the storage unit, the first data segment using a sequence comprising the one or more differences, one or more first sequence locations corresponding to each of the one or more differences, a reference to the second previously stored data segment, and one or more second sequence references, wherein the one or more second sequence references corresponding to a sequence of data from within the second previously stored segment identifying the subset of the second previously stored segment; and
   wherein in the event that the first data segment is not determined to be similar to the second previously stored data segment and that the first data segment is determined not to be identical to the first stored data segment, the delta compression system is further configured for storing the first data segment in the storage unit.

2. The system as in claim 1, wherein the deduplicating system receives a data stream or data block.

3. The system as in claim 2, wherein the deduplicating system breaks the data stream or data block into a plurality of data segments.

4. The system as in claim 1, wherein determining that the first data segment is identical comprises:
   determining a first data segment ID associated with the first data segment;
   determining whether the first data segment ID is identical to a previously stored ID in an ID index.

5. The system as in claim 4, where determining the first data segment ID associated with the first data segment uses one or more of the following: a fingerprint function, a hash function, a cryptographic hash function, and a digital signature.

6. The system as in claim 1, further comprising compressing the encoding of the first data segment in the event that the first data segment is determined to be similar to the second previously stored data segment.

7. The system as in claim 1, further comprising transmitting the encoding of the first data segment in the event that the first data segment is determined to be similar to the second previously stored data segment.

8. The system as in claim 1, further comprising replicating the encoding of the first data segment in the event that the first data segment is determined to be similar to the second previously stored data segment.

9. The system as in claim 1, wherein the encoding is based at least in part on the second previously stored data segment.

10. The system as in claim 1, wherein the encoding comprises an indication of a set of data blocks in the first data segment not present in the second previously stored data segment and an indication of a set of data blocks in the second previously stored data segment.

11. The system as in claim 1, wherein in the event that the first data segment is determined to be similar to the second previously stored data segment, the delta compression system further comprises determining whether the encoding is smaller than the first data segment.

12. The system as in claim 1, wherein the sketch function comprises a hash function.

13. The system as in claim 1, wherein the sketch function comprises a plurality of hash functions.

14. The system as in claim 1, wherein the sketch function comprises one or more functions that returns a similar value for similar data segments.

15. The system as in claim 1, wherein the sketch function comprises one or more functions that may return a same value for similar data segments.

16. The system as in claim 1, wherein the sketch function comprises one or more functions that may return a similar value for similar data segments.

17. The system as in claim 16, wherein sketch function values are determined to be similar based on one or more of the following methods: numeric difference, hamming distance, locality-sensitive-hashing, or nearest-neighbor-search.

18. The system as in claim 1, wherein in the event that the first data segment is determined to be similar to the second previously stored data segment, the delta compression system further comprises determining whether the first data segment is similar to one or more previously stored segments in addition to the second previously stored data segment.

19. The system as in claim 18, wherein in the event that the first data segment is determined to be similar to the one or more previously stored data segments, the encoding is based at least in part on the second previously stored data segment and the one or more additional similar previously stored data segments.

20. The system as in claim 18, wherein the one or more previously stored data segments and second previously stored data segment are identified based at least in part on one or more of the following: temporal locality, spatial locality, ease of access, expected compression, or frequency of selection for other compressed segments.

21. The system as in claim 1, wherein the second previously stored data segment was stored as an encoding of a third previously stored data segment.

22. A method for processing data, comprising:
   determining, using a processor, whether a first data segment is identical to a first previously stored data segment, wherein in the event that the first data segment is determined to be identical to the first previously stored data segment, a reference to the first data segment is stored in a storage unit; and
   determining, only in the event that the first data segment is determined not to be identical to the first previously stored data segment, whether the first data segment is similar to a second previously stored data segment, wherein the first data segment is determined to be similar to the second previously stored data segment using a sketch function, wherein the sketch function comprises one or more functions that returns a same value for similar data segments;
   in the event that the first data segment is determined to be similar to the second previously stored data segment, computing an encoding of the first data segment, wherein the encoding comprises determining one or more differences between the first data segment and the second previously stored data segment, and storing, in the storage unit, the first data segment using a sequence comprising the one or more differences, one or more first sequence locations corresponding to each of the one or more differences, a reference to the second previously stored data segment, and one or more second sequence references, wherein the one or more second sequence references corresponding to a sequence of data from within the second previously stored segment identifying the subset of the second previously stored segment; and
   in the event that the first data segment is not determined to be similar to the second previously stored data segment and that the first data segment is determined not to be identical to the first stored data segment, storing the first data segment in the storage unit.

23. The method as in claim 22, further comprising receiving a data stream or data block.

24. The method as in claim 22, further comprising breaking the data stream or data block into a plurality of data segments.

25. The method as in claim 22, wherein determining that the first data segment is identical comprises:
   determining a first data segment ID associated with the first data segment;
   determining whether the first data segment ID is identical to a previously stored ID in an ID index.

26. The method as in claim 25, where determining the first data segment ID associated with the first data segment uses one or more of the following: a fingerprint function, a hash function, a cryptographic hash function, and a digital signature.

27. The method as in claim 22, further comprising compressing the encoding of the first data segment in the event that the first data segment is determined to be similar to the second previously stored data segment.

28. The method as in claim 22, further comprising transmitting the encoding of the first data segment in the event that the first data segment is determined to be similar to the second previously stored data segment.

29. The method as in claim 22, further comprising replicating the encoding of the first data segment in the event that the first data segment is determined to be similar to the second previously stored data segment.

30. The method as in claim 22, wherein the encoding is based at least in part on the second previously stored data segment.

31. The method as in claim 22, wherein the encoding comprises an indication of a set of data blocks in the first data segment not present in the second previously stored data segment and an indication of a set of data blocks in the second previously stored data segment.

32. The method as in claim 22, further comprising determining whether the encoding is smaller than the first data segment in the event that the first data segment is determined to be similar to the second previously stored data segment.

33. The method as in claim 22, wherein the sketch function comprises a hash function.

34. The method as in claim 22, wherein the sketch function comprises a plurality of hash functions.

35. The method as in claim 22, wherein the sketch function comprises one or more functions that returns a similar value for similar data segments.

36. The method as in claim 22, wherein the sketch function comprises one or more functions that may return the same value for similar data segments.

37. The method as in claim 22, wherein the sketch function comprises one or more functions that may return a similar value for similar data segments.

38. The method as in claim 37, wherein sketch function values are determined to be similar based on one or more of the following methods: numeric difference, hamming distance, locality-sensitive-hashing, or nearest-neighbor-search.

39. The method as in claim 22, wherein in the event that the first data segment is determined to be similar to the second previously stored data segment, determining whether the first data segment is similar to one or more previously stored segments in addition to the second previously stored data segment.

40. The method as in claim 39, wherein the encoding is based at least in part on the second previously stored data segment and the one or more additional similar previously stored data segments.

41. The method as in claim 39, wherein the one or more previously stored data segments and second previously stored data segment are identified based at least in part on one or more of the following: temporal locality, spatial locality, ease of access, expected compression, or frequency of selection for other compressed segments.

42. The method as in claim 22, wherein the second previously stored data segment was stored as an encoding of a third previously stored data segment.

43. A computer program product for processing data, the computer program product being embodied in a non-transitory computer readable storage medium and comprising computer instructions for:

determining, using a processor, whether a first data segment is identical to a first previously stored data segment, wherein in the event that the first data segment is determined to be identical to the first previously stored data segment, a reference to the first data segment is stored in a storage unit; and determining, only in the event that the first data segment is determined not to be identical to the first previously stored data segment, whether the first segment is similar to a second previously stored data segment, wherein the first data segment is determined to be similar to the second previously stored data segment using a sketch function and the sketch function comprises one or more functions that returns a same value for similar data segments;

in the event that the first data segment is determined to be similar to the second previously stored data segment, computing an encoding of the first data segment, wherein the encoding comprises determining one or more differences between the first data segment and the second previously stored data segment, and storing, in the storage unit, the first data segment using a sequence comprising the one or more differences, one or more first sequence locations corresponding to each of the one or more differences, a reference to the second previously stored data segment, and one or more second sequence references, wherein the one or more second sequence references corresponding to a sequence of data from within the second previously stored segment identifying the subset of the second previously stored segment; and in the event that the first data segment is not determined to be similar to the second previously stored data segment and that the first data segment is determined not to be identical to the first stored data segment, storing the first data segment in the storage unit.

* * * * *